United States Patent
Vaisanen

(10) Patent No.: US 8,903,022 B2
(45) Date of Patent: Dec. 2, 2014

(54) DUAL CHANNEL RECEPTION

(75) Inventor: Risto Olavi Vaisanen, Salo (FI)

(73) Assignee: Nokia Corporation, Espoo (FI)

( * ) Notice: Subject to any disclaimer, the term of this patent is extended or adjusted under 35 U.S.C. 154(b) by 826 days.

(21) Appl. No.: 13/127,682

(22) PCT Filed: Nov. 4, 2009

(86) PCT No.: PCT/IB2009/054888
§ 371 (c)(1),
(2), (4) Date: Aug. 15, 2011

(87) PCT Pub. No.: WO2010/052646
PCT Pub. Date: May 14, 2010

(65) Prior Publication Data
US 2012/0039418 A1 Feb. 16, 2012

(30) Foreign Application Priority Data

Nov. 4, 2008 (FI) .................................... 20086047

(51) Int. Cl.
 H03K 9/06 (2006.01)
 H04L 5/06 (2006.01)
(52) U.S. Cl.
 CPC ........................................ *H04L 5/06* (2013.01)
 USPC ........... 375/322; 375/376; 375/147; 375/316; 331/44; 370/204
(58) Field of Classification Search
 USPC .................... 375/322, 376, 147, 316; 331/44; 370/204
 See application file for complete search history.

(56) References Cited

U.S. PATENT DOCUMENTS

| 5,311,151 A | 5/1994 | Vaisanen |
| 6,356,747 B1 | 3/2002 | Miquel et al. |
| 6,516,186 B1 | 2/2003 | Yamagishi et al. |
| 7,630,700 B2 | 12/2009 | Vaisanen |
| 7,668,527 B2 | 2/2010 | Vaisanen |
| 7,844,233 B2 | 11/2010 | Vaisanen |
| 8,126,421 B2 | 2/2012 | Vaisanen |
| 2007/0019758 A1* | 1/2007 | Haque et al. ................... 375/316 |
| 2009/0258628 A1* | 10/2009 | Lindoff et al. ................. 455/302 |
| 2009/0310717 A1 | 12/2009 | Huang et al. |

FOREIGN PATENT DOCUMENTS

| GB | 2279213 A | 12/1994 |
| WO | 2008/000383 A1 | 1/2008 |

OTHER PUBLICATIONS

Office Action received for corresponding Chinese Application No. 200980153455.4, dated Jan. 10, 2014, 8 pages.
"3rd Generation Partnership Project; Technical Specification Group Radio Access Network; Dual-Cell HSDPA operation", 3GPP TR 25.825, v1.0.0, May, 2008, pp. 1-67.
International Search Report and Written Opinion received for corresponding Patent Cooperation Treaty Application No. PCT/IB2009/054888, dated Mar. 4, 2010, 15 pages.
Office Action received for corresponding Chinese Patent Application No. 200980153455.4, dated Jun. 14, 2013, 11 pages.

* cited by examiner

*Primary Examiner* — Leila Malek
(74) *Attorney, Agent, or Firm* — Harrington & Smith

(57) ABSTRACT

There is provided a solution for simultaneous reception of dual channel transmission. The solution is based on applying a first and a second oscillating signals, mixing and adding in order to separate the in-phase and quadrature components of first and second signals from a combined radio frequency signal received as input.

17 Claims, 2 Drawing Sheets

DUAL CHANNEL RECEPTION

RELATED APPLICATION

This application was originally filed as Patent Cooperation Treaty Application No. PCT/IB2009/054888 filed Nov. 4, 2009, which claims priority to Finnish Application No. 20086047 filed Nov. 4, 2008.

FIELD

The invention relates generally to dual channel reception with one receiver.

BACKGROUND

It is an ongoing challenge to enhance the data rate in a mobile communication network. This may be pursued by developing completely new systems. An example of this type of evolution is the change in network architectures from a Global System for Mobile Communications (GSM) to a Universal Mobile Telecommunications System (UMTS) applying Wideband Code Division Multiple Access (WCDMA) and further to Long Term Evolution (LTE). Alternatively, the increase of the data rate may be obtained by developing the existing architectures. For example, a general packet radio service (GPRS) and enhanced data rates for global evolution (EDGE) were developed on top of the existing GSM network. Further, high-speed downlink packet access (HSDPA) was developed to coexist with the UMTS network.

One possible way to increase the data rate is to enable the dual channel reception in the mobile communication network. This technique is called a dual cell (DC) HSDPA. According to possible solutions for DC-HSDPA, a mobile terminal would require two separate receivers. Both of the receivers could separate the in-phase (I) and the quadrature (Q) branch from the received signal. The use of two receivers is, however, a highly space- and money-consuming solution. Alternatively, a diversity receiver of the mobile terminal could be applied together with the original receiver (such as a direct conversion receiver) for receiving two data channels simultaneously.

BRIEF DESCRIPTION OF EMBODIMENTS OF THE INVENTION

An aspect of the embodiments of the invention is to provide a novel solution for receiving two radio frequency signals comprised in one signal simultaneously in a mobile communication network.

According to another aspect of the invention, there is provided a method as specified in claim 1.

According to a further aspect of the invention, there is provided apparatuses as specified in claims 8, 15 and 22.

According to a further more aspect of the invention, there is provided a computer program product as specified in claim 23.

Embodiments of the invention are also defined in the dependent claims.

LIST OF DRAWINGS

In the following, the examples of the invention will be described in greater detail with reference to the embodiments and the accompanying drawings, in which FIG. 1 illustrates transmission of two signals;

DESCRIPTION OF EMBODIMENTS

The following embodiments are exemplary. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

Figure 1:
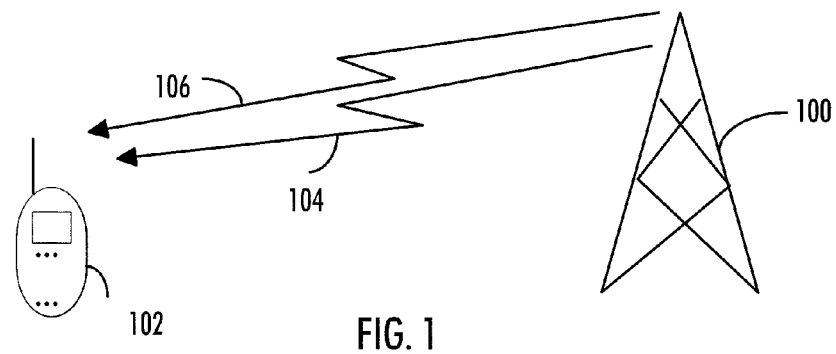

FIG. 1 illustrates transmission of two signals 104, 106 from a central node 100 to a target node 102. The central node 100 and the target node 102 may be located within one cell or the target node 102 may be located in a different cell than the central node 100 and the transmitted signals 104, 106 may be forwarded to the target node 102 by a relay node or a similar network element. The central node 100 and the target node 102 may occupy radio resources of the GSM, UMTS, LTE, or any other well-known network architecture. Thus, even though the embodiments of the invention are described using the UMTS and the HSDPA as a basis, the scope of the invention is not limited to it but is applicable to any network where the reception of two signals 104, 106 simultaneously is desired. Similarly, the scope of the invention is not limited to a downlink transmission but the embodiments of the invention can be applied in an uplink transmission as well.

The central node 100 may be a base station, an evolved node B as in the Evolved UMTS Terrestrial Radio Access Network (E-UTRAN). Further, the central node 100 may be a radio network controller (RNC) or any other apparatus capable of controlling a radio communication within the network. The target node 102 may be a mobile terminal, user equipment, palm computer, circuit, or any other apparatus capable of receiving radio frequency signals.

In the downlink transmission, the central node 100 may simultaneously transmit two separate radio frequency signals 104, 106 to the target node 102. The signals 104, 106 may be located within two separate frequency bands. That is, the signal 104 may be located within a frequency band of a downlink channel and the signal 106 may be located within a frequency band of a different downlink channel. In the target node, the two signals 104, 106 may be received as one radio frequency signal comprising the two signals 104, 106. The signals 104, 106 may be information-carrying data signals, pilot signals, control signals or any other signals that may need to be transmitted from the central node 100 to the target node 102. Thus, according to the embodiment, the target node 102 may simultaneously receive the two separate radio frequency signals 104, 106 using methods and radio network elements described below.

Figure 2:
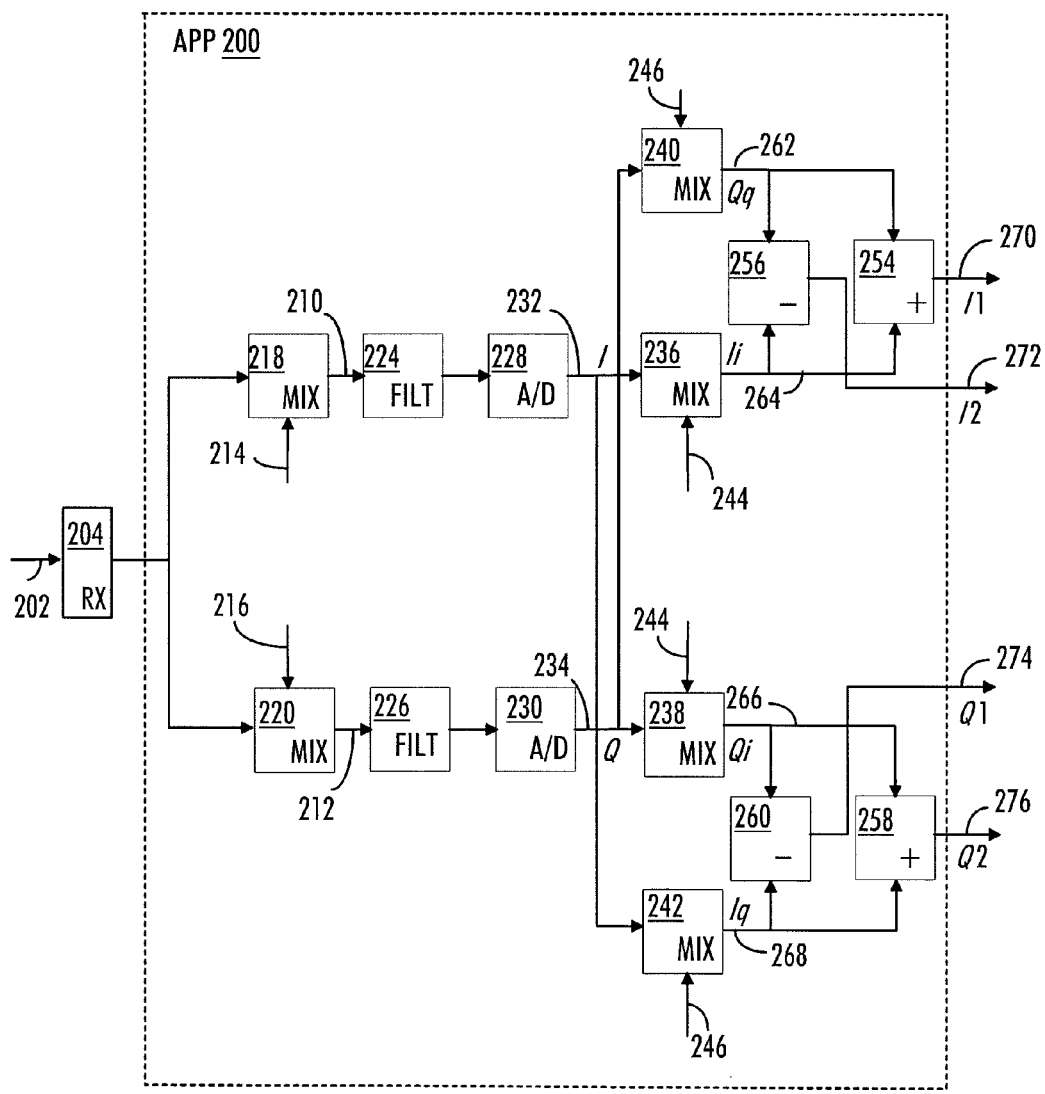
FIG. 2 shows a general architecture of an apparatus capable of receiving and separating the transmitted two radio frequency signals, comprised in one radio frequency signal, simultaneously, according to an embodiment of the invention.

A very general architecture of an apparatus 200 capable of receiving and separating the transmitted two radio frequency signals, comprised in one radio frequency signal, simultaneously according to an embodiment of the invention is shown in FIG. 2. FIG. 2 shows the elements and functional entities required for understanding the reception of the two radio frequency signals according to an embodiment of the invention. Other components have been omitted for reasons of simplicity. The implementation of the elements and functional entities may vary from that shown in FIG. 2. The connections shown in FIG. 2 are logical connections, and the actual physical connections may be different. It is apparent to a person skilled in the art that the apparatus 200 may also comprise other functions and structures.

The apparatus 200 may comprise an interface 204. According to an embodiment of the invention, the interface 204 is capable of receiving radio frequency electromagnetic energy from the air interface. Consequently, the interface 204 may comprise an antenna. Alternatively, the reception may occur via a wire such as a coaxial cable or a similar transmission medium. The interface 204 may include computer ports for providing communication capabilities. The interface 204 may perform signal-processing operations for enabling a physical channel connection, if needed. According to an embodiment of the invention, the interface 204 receives a combined radio frequency signal 202 comprising a first and a second signal, the first and the second signal being on frequency bands of a first and a second channels, respectively, wherein the channels have different center frequencies.

Figure 3:
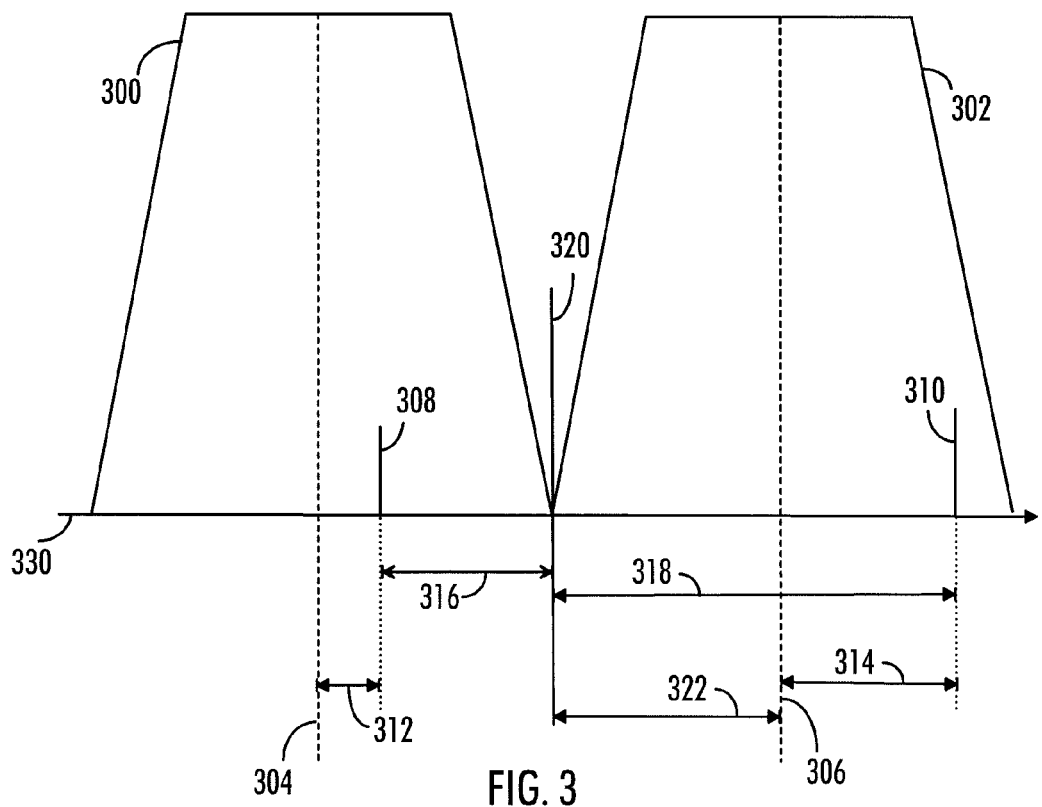
FIG. 3 shows how the received signals may be located in a frequency domain.

Before discussing further with regards to FIG. 2, let us take a look at how the first and the second signal may be located in a frequency domain. This is shown in FIG. 3. The axis 330 represents the frequency domain with lower frequencies on the left-hand side of the axis, and higher frequencies on the right-hand side of the axis.

The first and the second signals 308 and 310 may be received by the apparatus 200 of FIG. 2 on frequency bands of first and second channels 300 and 302. That is, according to an embodiment, the first and the second signals 308 and 310 are located within bandwidths of the first and the second channels 300 and 302. The center frequencies of the first and the second channels 300 and 302 are shown with dotted lines and with reference numbers 304 and 306. Center frequencies 304 and 306 in the HSDPA network topology may be within a range from 700 MHz to 2200 MHz. The base-band representation of the first and the second signals 308 and 310 are shown with reference numbers 312 and 314. Base-band values for the first and the second signal 308 and 310 may be within a range from 0 Hz to 5 MHz. The base-band signals 312 and 314 may have been used in a transmitter (central node in the downlink transmission or mobile terminal in the uplink transmission) together with a local oscillator of the transmitter to form the radio frequency signals 308 and 310.

According to an embodiment of the invention, the center frequencies 304 and 306 of the first and the second channels 300 and 302 are separated by a channel bandwidth applied in the reception of the combined radio frequency signal. According to an embodiment of the invention, the channel bandwidth is, at the maximum, 5 MHz.

The first and the second signals 308 and 310 in FIG. 3 are merely examples of signals received from the air interface. They may be sine signals that are used in testing the communication network, or they may represent modulated radio frequency signals at a certain point of time. For example, in the HSDPA topology applied together with the WCDMA, the radio frequency signals are hopping arbitrarily according to the spreading code of the WCDMA within the whole frequency band of the channel. Thus, at any point of time, the frequency bands 300 and 302 may be occupied by a large number of signals 308 and 310 with different spreading codes used to separate them from each other. Even though the description of the embodiments of the invention aims at separating one first signal 308 and one second signal 310 from the combined radio frequency signal, the embodiments of the invention are not limited to separating signals with certain spreading codes but can be applied to a separation of any first and second signals located anywhere within the frequency bands of the first and the second channels 300 and 302, wherein the signals 308 and 310 may have any known spreading code.

Let us now discuss further with regard to FIG. 2. According to an embodiment, the combined radio frequency signal 202 is divided into an in-phase component 210 and a quadrature component 212.

Thus, according to an embodiment, mixing a first oscillating signal 214 with the combined radio frequency signal 202 at a mixer 218 leads to obtaining the in-phase component 210 of the combined radio frequency signal 202. The frequency of the first oscillating signal may be in the middle of the center frequencies of the first and the second channels. This is shown in FIG. 3 with reference number 320. FIG. 3 also shows intermediate frequencies (IF) 316 (IF1) and 318 (IF2). They represent the differences between the frequency of the first oscillating signal 320 (O1) to the first signal 308 (S1) and to the second signal 310 (S2), respectively. That is, they may be given as $$f_{IF1} = f_{O1} - f_{S1}, \text{ and} \tag{1}$$

$$f_{IF2} = f_{S2} - f_{O1}. \tag{2}$$

Further, from (1) and (2) we can derive representations for the first signal 308 (S1) and the second signal 310 (S2) as $$S1 = \sin(2 \cdot \pi \cdot f_{O1} - 2 \cdot \pi \cdot f_{IF1})t = \sin(\omega_{O1} - \omega_{IF1})t, \text{ and} \tag{3}$$

$$S2 = \sin(2 \cdot \pi \cdot f_{O1} + 2 \cdot \pi \cdot f_{IF2})t = \sin(\omega_{O1} + \omega_{IF2})t, \tag{4}$$

where $2 \cdot \pi \cdot f_{O1} = \omega_{O1}$, $2 \cdot \pi \cdot f_{IF1} = \omega_{IF1}$, and $2 \cdot \pi \cdot f_{IF2} = \omega_{IF2}$.

Further, mixing of a quadrature 216 of the first oscillating signal 214 with the combined radio frequency signal 202 at a mixer 220 may lead to obtaining the quadrature component 212 of the combined radio frequency signal 202.

The mixers 218 and 220 may output two mixing results: one in which the two signals to be mixed are summed (added) and another where the two signals to be mixed are subtracted from each other. According to an embodiment of the invention, only the outputs that which comprise the subtracted results, are applied. Consequently, at least one filter may be applied to filter out the summed outputs of each of the mixers 218 and 220. For example, a filter 224 filters out the summed output of the mixer 218, and a filter 226 filters out the summed output of the mixer 220. The filters 224, 226 may be implemented with one or more filters. That is, FIG. 2 has separate filters for the reasons of simplicity and the actual implementation may be different.

Further, the in-phase component 210 and the quadrature component 212 may be converted to digital form. This may be performed by at least one converter 228 and 230. That is, FIG. 2 has separate converters for the reasons of simplicity and the actual implementation may be different. The at least one converter may be an analog-to-digital converter (ADC), in which an analog input is digitized on the basis of a characteristic of the analog input. The characteristic may be, for example, an amplitude or a phase of the analog input. The apparatus 200 may naturally comprise other components, for example, a power amplifier prior to quantization even though not shown in FIG. 2.

Consequently, the in-phase component 232 (I) of the combined radio frequency signal 202 after filtration and digitization may be represented as $$I = [\sin(\omega_{O1} - \omega_{IF1})t + \sin(\omega_{O1} + \omega_{IF2})t] - \sin(\omega_{O1}t) = \sin(\omega_{IF1}t) + \sin(\omega_{IF2}t). \tag{5}$$

Similarly, the quadrature component 234 (Q) of the combined radio frequency signal 202 after filtration and digitization may be represented as $$Q=[\sin(\omega_{O1}-\omega_{IF1})t+\sin(\omega_{O1}+\omega_{IF2})t]-\sin(\omega_{O1}t+90°)$$
$$=\sin(\omega_{IF1}t-90°)+\sin(\omega_{IF2}t+90°). \quad (6)$$

Thus, after applying the first oscillating signal 214 and the quadrature 216 of the first oscillating signal 214 to form the IF representation of the in-phase 232 and quadrature component 234 of the combined radio frequency signal 202, the further object of the apparatus 200 is to separate the base-band representation of the in-phase and quadrature components of the first and the second signals from the IF representation of the in-phase 232 and quadrature components 234 of the combined radio frequency signal 202.

According to an embodiment of the invention, separating in-phase and quadrature components of the first and the second signals from the in-phase 232 and quadrature components 234 of the combined radio frequency signal 202 is performed next. The separation may be performed with digital signal processing manners.

According to an embodiment of the invention, a second oscillating signal 244 and a quadrature 246 of the second oscillating signal 244 are mixed in mixers with the in-phase 232 and quadrature component 234 of the combined radio frequency signal 202. The use of the second oscillating signal 244 and the quadrature 246 of the second oscillating signal 244 may enable the converting of the first and the second signal from the IF frequencies 316 and 318 of FIG. 3 to base-band frequencies 312 and 314. The first base-band frequency signal (B1) and the second base-band frequency signal (B2) may be represented as $$B1=\sin(2\cdot\pi\cdot f_{B1})t=\sin(\omega_{B1}t) \quad (7)$$

$$B2=\sin(2\cdot\pi\cdot f_{B2})t=\sin(\omega_{B2}t). \quad (8)$$

The use of the second oscillating signal 244 and the quadrature 246 of the second oscillating signal 244 may also be advantageous in terms of combating the unwanted mirror frequencies caused by the mixers 218 and 220. That is, the in-phase component 232 and the quadrature component 234, generated by the mixers 218 and 220 and being 90 degrees phase shifted compared to each other, may lead to unwanted mirror frequencies. The mirror frequency can be attenuated by performing another frequency shift of 90 degrees. This may be obtained by applying the second oscillating signal 244 and the quadrature 246 of the second oscillating signal 244 to the in-phase 232 and quadrature components 234 of the combined radio frequency signal 202.

The first oscillating signal 214 and the second oscillating signal 244 may be originated from a frequency synthesizer associated with one or more frequency dividers. This may enable the original frequency of a local oscillating signal, before the frequency dividers, to be at a different frequency than at the frequency of the received combined radio frequency signal 202. The dividers may also be used to produce phase shifts of the signals, that is, the quadrature of the first oscillating signal 216 and the quadrature of the second oscillating signal 246. Other means for providing a phase shift naturally exists and may be applied. In other words, the quadrature component of a signal has a 90 degrees phase difference compared to the in-phase component of the signal.

The use of mixers together with the second oscillating signal 244 and the quadrature 246 of the second oscillating signal 244 will be described next. According to an embodiment, the mixers mix the second oscillating signal 244 with the in-phase 232 and quadrature 234 components of the combined radio frequency signal 202. Further, the mixers mix the quadrature 246 of the second oscillating signal 244 with the quadrature 234 and with the in-phase component 232 of the combined radio frequency signal 202. The frequency of the second oscillating signal 244 may be a half of the difference between the center frequencies of the first and the second channels. This is shown in FIG. 3 with reference number 322. For example, if the channel bandwidth, separating the two channels 300 and 302, is 5 MHz, the frequency of the second oscillating signal 322 may be 2.5 MHz.

The apparatus 200 may comprise a mixer 236. The mixer 236 mixes the second oscillating signal 244 with the in-phase component 232 of the combined radio frequency signal 202. That is, the output 264 of the mixer 236 may be represented as $$Ii=\sin(\omega_{B1}t)+\sin(\omega_{B2}t). \quad (9)$$

The apparatus 200 may further comprise a mixer 238. The mixer 238 mixes the second oscillating signal 244 with the quadrature component 234 of the combined radio frequency signal 202. The output 266 of the mixer 238 may be represented as $$Qi=\sin(\omega_{B1}t-90°)+\sin(\omega_{B2}t+90°). \quad (10)$$

The apparatus 200 may further comprise a mixer 240. The mixer 240 mixes the quadrature 246 of the second oscillating signal 244 with the quadrature component 234 of the combined radio frequency signal 202. The output 262 of the mixer 240 may be represented as $$Qq=\sin(\omega_{B1}t-90°+90°)+\sin(\omega_{B2}t+90°+90°). \quad (11)$$

The apparatus 200 may further comprise a mixer 242. The mixer 242 mixes the quadrature 246 of the second oscillating signal 244 with the in-phase component 232 of the combined radio frequency signal 202. The output 268 of the mixer 242 may be represented as $$Iq=\sin(\omega_{B1}t+90°)+\sin(\omega_{B2}t+90°). \quad (12)$$

The mixers 218, 220, 236 to 242 may be implemented with one or more mixers. That is, FIG. 2 has separate mixers for reasons of simplicity and the actual implementation may be different. For example, the apparatus 200 may comprise a multiplexing element in which the signals to be mixed are, in turns, processed and mixed.

In an embodiment, the outputs of the mixers 236, 238, 240 and 242 are fed as inputs to adders and subtractors. The adders and the subtractors may be applied to separate the in-phase and quadrature components of the first and the second signals. This will be described next.

The apparatus 200 may further comprise an adder 254. The adder 254 adds the second oscillating signal 244 mixed with the in-phase component 232 of the combined radio frequency signal 202 to the quadrature 246 of the second oscillating signal 244 mixed with the quadrature component 234 of the combined radio frequency signal 202 to obtain the in-phase component of the first signal 270 (I1). The output of the adder 254 may be represented as $$I1=Qq+Ii=\sin(\omega_{B1}t-90°+90°)+\sin(\omega_{B2}t+90°+90°+\sin(\omega_{B1}t)+\sin(\omega_{B2}t)=2\sin(\omega_{B1}t). \quad (13)$$

The apparatus 200 may further comprise a subtractor 256. The subtractor 256 subtracts the quadrature 246 of the second oscillating signal 244 mixed with the quadrature component 234 of the combined radio frequency signal 202 from the second oscillating signal 244 mixed with the in-phase component 232 of the combined radio frequency signal 202 to obtain the in-phase component of the second signal 272 (I2). The output of the subtractor 256 may be represented as $$I2 = Ii - Qq = \sin(\omega_{B1}t) + \sin(\omega_{B2}t) - (\sin(\omega_{B1}t - 90° + 90°) + \sin(\omega_{B2}t + 90° + 90°)) = 2\sin(\omega_{B2}t). \quad (14)$$

The apparatus 200 may further comprise an adder 258. The adder 258 adds the second oscillating signal 244 mixed with the quadrature component 234 of the combined radio frequency 202 signal to the quadrature 246 of the second oscillating signal 244 mixed with the in-phase component 232 of the combined radio frequency signal 202 to obtain the quadrature component of the second signal 276 (Q2). The output of the adder 258 may be represented as $$Q2 = Qi + Iq = \sin(\omega_{B1}t - 90°) + \sin(\omega_{B2}t + 90°) + \sin(\omega_{B1}t + 90°) + \sin(\omega_{B2}t + 90°) = 2\cos(\omega_{B2}t) \quad (15)$$

The apparatus 200 may further comprise a subtractor 260. The subtractor 260 subtracts the second oscillating signal 244 mixed with the quadrature component 234 of the combined radio frequency signal 202 from the quadrature 246 of the second oscillating signal 244 mixed with the in-phase component 232 of the combined radio frequency signal 202 to obtain the quadrature component of the first signal 274 (Q1). The output of the subtractor 260 may be represented as $$Q1 = Iq - Qi = \sin(\omega_{B1}t + 90°) + \sin(\omega_{B2}t + 90°) - (\sin(\omega_{B1}t - 90°) + \sin(\omega_{B2}t + 90°)) = 2\cos(\omega_{B1}t). \quad (16).$$

Thus, it is shown that the in-phase component 270 (I1) and the quadrature component 274 (Q1) of the first signal and the in-phase component 272 (I2) and the quadrature component 276 (Q2) of the second signal may be extracted from the combined radio frequency signal 202 received as input to the apparatus 200, wherein the combined radio frequency signal 202 comprises the first and the second signals.

The adders and the subtractors 254 to 260 may be implemented with one or more adders and the subtractors. So FIG. 2 has separate adders and the subtractors for the reasons of simplicity and the actual implementation may be different.

According to an embodiment of the invention, the functional blocks in FIG. 2, including the one or more mixers, the one or more filters, the one or more amplifiers, the one or more converters, the one or more adders, the one or more distractors, etc., may be realized with one or more processors. The processors may be implemented with separate digital signal processors provided with suitable software embedded on a computer readable medium, or with separate logic circuits, such as application specific integrated circuits (ASIC). The processors may comprise interfaces such as computer ports for providing communication capabilities.

According to an embodiment of the invention, the apparatus 200 of FIG. 2 may further comprise a processor. The processor may be implemented with a separate digital signal processor provided with suitable software embedded on a computer readable medium, or with a separate logic circuit, such as an ASIC. The processor may comprise an interface, such as a computer port for providing communication capabilities to other functional elements of the apparatus 200.

According to an embodiment of the invention, the processor controls the function of the apparatus 200. That is, the processor controls the utilization of the first oscillating signal 214, the quadrature 216 of the first oscillating signal 214, the second oscillating signal 244 and the quadrature 246 of the second oscillating signal 244. Further, the processor may control the mixing, filtering amplifying, adding, subtracting, etc. The processor may further control the utilization of other functional elements of the apparatus 200 including, for example, the one or more mixers, the one or more filters, the one or more amplifiers, the one or more converters, the one or more adders, the one or more distractors, etc.

According to an embodiment of the invention, the apparatus 200 is employed during high-speed downlink packet access (HSDPA) reception. However, the embodiments of the invention are not limited to HSDPA, but can be applied in any network where dual channel reception is desired.

Figure 4:
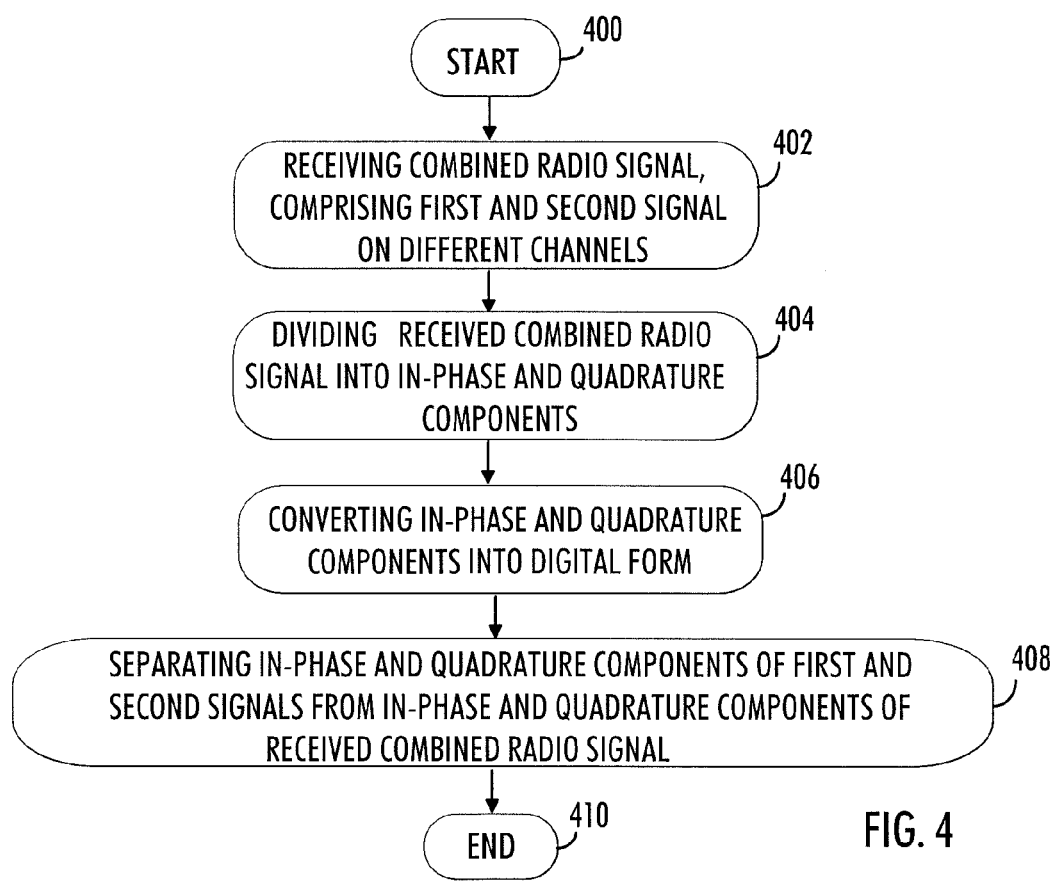
FIG. 4 illustrates a method for performing the dual channel reception according to an embodiment of the invention.

FIG. 4 illustrates a method for dual channel reception according to an embodiment of the invention. The method begins in step 400. In step 402, reception of the combined radio frequency signal comprising the first and the second signals is performed. The first and the second signal are on frequency bands of the first and the second channels, respectively, wherein the channels have different center frequencies.

Step 404 of the method comprises dividing the combined radio frequency signal into the in-phase component and the quadrature component. This step may also comprise the utilization of mixers in order to form the in-phase and quadrature components of the combined radio frequency signal. Further, filters, amplifiers and analog-to-digital converters may be applied in this step.

In step 406, the converting of the in-phase and quadrature components of the combined radio frequency signal into digital form takes place. The converting may be performed with an analog-to-digital converter.

Step 408 of the method comprises separating the in-phase and quadrature components of the first and the second signals from the in-phase and quadrature components of the combined radio frequency signal. This step may also comprise the utilization of digital signal processing in order to form the in-phase and quadrature components of the first and the second signals. The method ends in step 410.

The techniques and methods described herein may be implemented by various means. For example, these techniques may be implemented in hardware (one or more devices), firmware (one or more devices), software (one or more modules), or combinations thereof. For a hardware implementation, the apparatus may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chip set (e.g., procedures, functions, and so on) that perform the functions described herein. The software codes may be stored in a memory unit and executed by processors. The memory unit may be implemented within the processor or externally to the processor. In the latter case it can be communicatively coupled to the processor via various means, as is known in the art. Additionally, the components of the systems described herein may be rearranged and/or complimented by additional components in order to facilitate the achieving of the various aspects, etc., described with regard thereto, and they are not limited to the precise configurations set forth in the given figures, as will be appreciated by one skilled in the art.

Thus, according to an embodiment, the apparatus for performing the tasks of FIGS. 2 and 4 comprises means for receiving the combined radio frequency signal comprising the first and the second signals, the first and the second signal being on frequency bands of the first and the second channels, respectively, wherein the channels have different center frequencies. Further, the apparatus comprises means for dividing the combined radio frequency signal into the in-phase and quadrature components, and means for separating the in-phase and quadrature components of the first and the second signals from the in-phase and quadrature components of the combined radio frequency signal.

Embodiments of the invention may be implemented as a computer program in the apparatus according to the embodiments of the invention. The computer program comprises instructions for executing a computer process for performing the dual channel reception. The computer program implemented in the apparatus may carry out, but is not limited to, the tasks related to FIGS. 2 and 4.

The computer program may be stored on a computer program distribution medium readable by a computer or a processor. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but can be modified in several ways within the scope of the appended claims. Further, it is clear to a person skilled in the art that the described embodiments may, but are not required to, be combined with other embodiments in various ways.

The invention claimed is:

1. A method, comprising:
receiving a combined radio frequency signal comprising a first and a second signals, the first and the second signals being on frequency bands of a first and a second channels, respectively, wherein the channels have different center frequencies;
dividing the combined radio frequency signal into an in-phase component and a quadrature component by mixing a first oscillating signal with the combined radio frequency signal to obtain the in-phase component of the combined radio frequency signal, the frequency of the first oscillating signal being in the middle of the center frequencies of the first and the second channels; and mixing a quadrature of the first oscillating signal with the combined radio frequency signal to obtain the quadrature component of the combined radio frequency signal;
converting the in-phase and quadrature components of the combined radio frequency signal into digital form;
separating in-phase and quadrature components of the first and the second signals from the in-phase and quadrature components of the combined radio frequency signal;
mixing a second oscillating signal with the in-phase component and with the quadrature component of the combined radio frequency signal, the frequency of the second oscillating signal being a half of a difference between the center frequencies of the first and the second channels; and
mixing a quadrature of the second oscillating signal with the quadrature and in-phase components of the combined radio frequency signal.

2. The method according to claim 1, further comprising:
adding the second oscillating signal mixed with the in-phase component of the combined radio frequency signal to the quadrature of the second oscillating signal mixed with the quadrature component of the combined radio frequency signal to obtain the in-phase component of the first signal;
subtracting the quadrature of the second oscillating signal mixed with the quadrature component of the combined radio frequency signal from the second oscillating signal mixed with the in-phase component of the combined radio frequency signal to obtain the in-phase component of the second signal;
adding the second oscillating signal mixed with the quadrature component of the combined radio frequency signal to the quadrature of the second oscillating signal mixed with the in-phase component of the combined radio frequency signal to obtain the quadrature component of the second signal; and
subtracting the second oscillating signal mixed with the quadrature component of the combined radio frequency signal from the quadrature of the second oscillating signal mixed with the in-phase component of the combined radio frequency signal to obtain the quadrature component of the first signal.

3. The method according to claim 1, further comprising:
attenuating mirror frequencies of the first and the second signals.

4. The method according to claim 1, wherein the center frequencies of the first and the second channels are separated by a channel bandwidth applied in the reception of the combined radio frequency signal.

5. The method according to claim 1, further comprising: employing the method during high-speed downlink packet access reception.

6. An apparatus, comprising:
at least one processor; and
at least one memory including computer program code, where the at least one memory and the computer program code are configured, with the at least one processor, to cause the apparatus to at least:
receive a combined radio frequency signal comprising a first and a second signals, the first and the second signals being on frequency bands of a first and a second channels, respectively, wherein the channels have different center frequencies; and to control:
a division of the combined radio frequency signal into an in-phase component and a quadrature component;
a converting of the in-phase and quadrature components of the combined radio frequency signal into digital form;
a separation of in-phase and quadrature components of the first and the second signal from the in-phase and quadrature components of the combined radio frequency signal;
a mixing of a first oscillating signal with the combined radio frequency signal to obtain the in-phase component of the combined radio frequency signal, the frequency of the first oscillating signal being in the middle of the center frequencies of the first and the second channels;
a mixing of a quadrature of the first oscillating signal with the combined radio frequency signal to obtain the quadrature component of the combined radio frequency signal;
a mixing of a second oscillating signal with the in-phase component and with the quadrature component of the combined radio frequency signal, the frequency of the second oscillating signal being a half of the difference between the center frequencies of the first and the second channels; and
a mixing of a quadrature of the second oscillating signal with the quadrature and in-phase components of the combined radio frequency signal.

7. The apparatus according to claim 6, wherein the at least one memory including the computer program code is configured with the at least one processor to cause the apparatus to:
control an adding of the second oscillating signal mixed with the in-phase component of the combined radio frequency signal to the quadrature of the second oscillating signal mixed with the quadrature component of the combined radio frequency signal to obtain the in-phase component of the first signal;
control a subtracting of the quadrature of the second oscillating signal mixed with the quadrature component of the combined radio frequency signal from the second oscillating signal mixed with the in-phase component of the combined radio frequency signal to obtain the in-phase component of the second signal;
control an adding of the second oscillating signal mixed with the quadrature component of the combined radio frequency signal to the quadrature of the second oscillating signal mixed with the in-phase component of the combined radio frequency signal to obtain the quadrature component of the second signal; and
control a subtracting of the second oscillating signal mixed with the quadrature component of the combined radio frequency signal from the quadrature of the second oscillating signal mixed with the in-phase component of the combined radio frequency signal to obtain the quadrature component of the first signal.

8. The apparatus according to claim 6, wherein the at least one memory including the computer program code is configured with the at least one processor to cause the apparatus to:
control an attenuating of mirror frequencies of the first and the second signal.

9. The apparatus according to claim 6, wherein the center frequencies of the first and the second channels are separated by a channel bandwidth applied in the reception of the combined radio frequency signal.

10. The apparatus according to claim 6, wherein the apparatus is employed during high-speed downlink packet access reception.

11. An apparatus, comprising:
at least one processor; and
at least one memory including computer program code, where the at least one memory and the computer program code are configured, with the at least one processor, to cause the apparatus to at least:
receive a combined radio frequency signal comprising a first and a second signals, the first and the second signals being on frequency bands of a first and a second channels, respectively, wherein the channels have different center frequencies;
divide the combined radio frequency signal into an in-phase component and a quadrature component;
convert of the in-phase and quadrature components of the combined radio frequency signal into digital form;
separate in-phase and quadrature components of the first and the second signals from the in-phase and quadrature components of the combined radio frequency signal;
mix a first oscillating signal with the combined radio frequency signal to obtain the in-phase component of the combined radio frequency signal, the frequency of the first oscillating signal being in the middle of the center frequencies of the first and the second channels;
mix a quadrature of the first oscillating signal with the combined radio frequency signal to obtain the quadrature component of the combined radio frequency signal;
mix a second oscillating signal with the in-phase component of the combined radio frequency signal, the frequency of the second oscillating signal being a half of the difference between the center frequencies of the first and the second channels;
mix the second oscillating signal with the quadrature component of the combined radio frequency signal;
mix a quadrature of the second oscillating signal with the quadrature component of the combined radio frequency signal; and
mix the quadrature of the second oscillating signal with the in-phase component of the combined radio frequency signal.

12. The apparatus according to claim 11, wherein the at least one memory including the computer program code is configured with the at least one processor to cause the apparatus to:
add outputs of the second oscillating signal mixed with the quadrature component of the combined radio frequency signal with the quadrature of the second oscillating signal mixed with the quadrature component of the combined radio frequency signal to obtain the in-phase component of the first signal;
subtract an output of the quadrature of the second oscillating signal mixed with the quadrature component of the combined radio frequency signal from the second oscillating signal mixed with the in-phase component of the combined radio frequency signal to obtain the in-phase component of the second signal;
add the second oscillating signal mixed with the quadrature component of the combined radio frequency signal to the quadrature of the second oscillating signal mixed with the in-phase component of the combined radio frequency signal to obtain the quadrature component of the second signal; and
subtract the second oscillating signal mixed with the quadrature component of the combined radio frequency signal from an output of the quadrature of the second oscillating signal mixed with the in-phase component of the combined radio frequency signal to obtain the quadrature component of the first signal.

13. The apparatus according to claim 11, wherein the at least one memory including the computer program code is configured with the at least one processor to cause the apparatus to attenuate mirror frequencies of the first and the second signals.

14. The apparatus according to claim 11, wherein the center frequencies of the first and the second channels are separated by a channel bandwidth applied in the reception of the combined radio frequency signal.

15. The apparatus according to claim 11, wherein the apparatus is employed during high-speed downlink packet access reception.

16. An apparatus, comprising:
means for receiving a combined radio frequency signal comprising a first and a second signals, the first and the second signals being on frequency bands of a first and a second channels, respectively, wherein the channels have different center frequencies;
means for dividing the combined radio frequency signal into an in-phase component and a quadrature component, comprising a first mixer configured to mix a first oscillating signal with the combined radio frequency signal to obtain the in-phase component of the combined radio frequency signal, the frequency of the first oscillating signal being in the middle of the center frequencies of the first and the second channels; and a second mixer configured to mix a quadrature of the first oscillating signal with the combined radio frequency signal to obtain the quadrature component of the combined radio frequency signal;

means for converting the in-phase and quadrature components of the combined radio frequency signal into digital form;

means for separating in-phase and quadrature components of the first and the second signals from the in-phase and quadrature components of the combined radio frequency signal;

means for mixing a second oscillating signal with the in-phase component and with the quadrature component of the combined radio frequency signal, the frequency of the second oscillating signal being a half of a difference between the center frequencies of the first and the second channels; and means for mixing a quadrature of the second oscillating signal with the quadrature and in-phase components of the combined radio frequency signal.

17. A non-transitory computer-readable storage medium embodying a computer program product comprising a program code which, when run on a processor, executes a method comprising:

controlling a reception of a combined radio frequency signal comprising a first and a second signals, the first and the second signals being on frequency bands of a first and a second channels, respectively, wherein the channels have different center frequencies;

dividing the combined radio frequency signal into an in-phase component and a quadrature component by mixing a first oscillating signal with the combined radio frequency signal to obtain the in-phase component of the combined radio frequency signal, the frequency of the first oscillating signal being in the middle of the center frequencies of the first and the second channels;

mixing a quadrature of the first oscillating signal with the combined radio frequency signal to obtain the quadrature component of the combined radio frequency signal;

converting the in-phase and quadrature components of the combined radio frequency signal into digital form;

separating in-phase and quadrature components of the first and the second signals from the in-phase and quadrature components of the combined radio frequency signal;

mixing a second oscillating signal with the in-phase component and with the quadrature component of the combined radio frequency signal, the frequency of the second oscillating signal being a half of a difference between the center frequencies of the first and the second channels; and mixing a quadrature of the second oscillating signal with the quadrature and in-phase components of the combined radio frequency signal.

* * * * *